United States Patent
Coapman et al.

[11] Patent Number: 5,926,731
[45] Date of Patent: Jul. 20, 1999

[54] METHOD FOR CONTROLLING SOLDER BUMP SHAPE AND STAND-OFF HEIGHT

[75] Inventors: Christine Redder Coapman; Christine Ann Paszkiet; Ralph Edward Cornell, all of Kokomo, Ind.

[73] Assignee: Delco Electronics Corp., Kokomo, Ind.

[21] Appl. No.: 08/887,064

[22] Filed: Jul. 2, 1997

[51] Int. Cl.$^6$ .................................................. H01L 21/44
[52] U.S. Cl. .................... 438/613; 438/612; 438/126; 438/106
[58] Field of Search .................... 438/613, 106, 438/17, 126, 612, 614, 615

[56] References Cited

U.S. PATENT DOCUMENTS

| | | | |
|---|---|---|---|
| 4,661,375 | 4/1987 | Thomas | 438/615 |
| 4,954,458 | 9/1990 | Reid | 438/613 |
| 5,162,257 | 11/1992 | Yung | 438/613 |
| 5,266,520 | 11/1993 | Cipolla et al. | 438/106 |
| 5,381,946 | 1/1995 | Koopman et al. | 205/123 |
| 5,480,835 | 1/1996 | Carney et al. | 438/615 |
| 5,496,770 | 3/1996 | Park | 438/613 |
| 5,635,424 | 6/1997 | Rostoker et al. | 438/106 |

*Primary Examiner*—Kevin M. Picardat
*Assistant Examiner*—Deven Collins
*Attorney, Agent, or Firm*—Jimmy L. Funke

[57] ABSTRACT

A conductor (112) and method for attaching a surface mount device to the conductor (112), in which solder bumps (16) formed by the method are characterized as being accurately located on the conductor (112) and having a bump height and shape that provides stress relief during thermal cycles, minimizes bridging between adjacent bumps (16), allows penetration of cleaning solutions for removing undesirable residues, and enables the penetration of mechanical bonding and encapsulation materials between the chip and its substrate (10). Such benefits are achieved by forming the conductor (112) of a nonsolderable material, on which a solderable pillar (114) is formed. The pillar (114) is selectively formed to have a shape that determines the distribution and height of the solder bump (16) on the conductor (112).

9 Claims, 2 Drawing Sheets

METHOD FOR CONTROLLING SOLDER BUMP SHAPE AND STAND-OFF HEIGHT

FIELD OF THE INVENTION

The present invention generally relates to surface mount (SM) circuit devices. More particularly, this invention relates to a method for controlling the shape and height of solder bump connections formed by attachment of a surface mount device to a conductor pattern.

BACKGROUND OF THE INVENTION

A flip chip is generally a monolithic surface mount (SM) semiconductor device, such as an integrated circuit, having bead-like terminals formed on one of its surfaces. The terminals, typically in the form of solder bumps, serve to both secure the chip to a circuit board and electrically interconnect the flip chip circuitry to a conductor pattern formed on the circuit board, which may be a ceramic substrate, printed wiring board, flexible circuit, or a silicon substrate. Due to the numerous functions typically performed by the microcircuitry of a flip chip, a relatively large number of solder bumps are required. The solder bumps are typically located at the perimeter of the flip chip on electrically conductive pads that are electrically interconnected with the circuitry on the flip chip. The size of a typical flip chip is generally on the order of a few millimeters per side, resulting in the solder bumps being crowded along the perimeter of the flip chip. As a result, flip chip conductor patterns are typically composed of numerous individual conductors that are typically spaced apart about 0.5 millimeter or less.

Because of the narrow spacing required for the solder bumps and conductors, soldering a flip chip to its conductor pattern requires a significant degree of precision. Reflow solder techniques are widely employed for this purpose, and typically entail precisely depositing a controlled quantity of solder on the flip chip using methods such as electrodeposition. Once deposited, heating the solder above its liquidus temperature serves to form the characteristic solder bumps on the surface of the flip chip. After cooling to solidify the solder bumps, the chip is soldered to the conductor pattern by registering the solder bumps with their respective conductors and then reheating, or reflowing, the solder so as to metallurgically adhere, and thereby electrically interconnect, each solder bump with its corresponding conductor, forming what will be referred to herein as a solder bump connection.

Placement of the chip and reflow of the solder must be precisely controlled not only to coincide with the spacing of the terminals and the size of the conductors, but also to control the height of the solder bump connections after soldering. As is well known in the art, controlling the height of solder bump connections after reflow is often necessary to prevent the surface tension of the molten solder bumps from drawing the flip chip excessively close to the substrate during the reflow operation. Sufficient spacing between the chip and its substrate, which may be termed the "stand-off height," is desirable for enabling stress relief during thermal cycles, allowing penetration of cleaning solutions for removing undesirable processing residues, and enabling the penetration of mechanical bonding and encapsulation materials between the chip and its substrate.

Solder bump position and height are generally controlled by the amount of solder deposited on the flip chip to form the solder bump and/or by limiting the surface area over which the solder bump is allowed to reflow. As illustrated in FIG. 1 showing a conductor 12 shown in longitudinal cross-section, the latter approach typically involves the use of solder stops 14, which can be formed by a solder mask or printed dielectric. The solder stops 14 are shown as extending widthwise across the surface 18 of the conductor 12, which has been printed or otherwise formed on a circuit substrate 10. A flip chip solder bump 16 (minus the flip chip) is shown as being positioned at the surface 18 of the conductor 12, as would be the case after a flip chip has been registered but before being reflow soldered to the conductor 12. As is apparent from FIG. 1, the solder stops 14 delineate a rectangular-shaped area on the surface 18 of the conductor 12 over which the solder bump 16 is able to flow during reflow. By properly locating the solder stops 14 on the conductor 12, the degree to which the molten solder can spread during reflow is controlled, which in turn determines the height of the solder bump 16 and therefore the stand-off height of the flip chip relative to the substrate 10. Within certain limits, a smaller reflow area results in a greater solder bump height after reflow for a given quantity of solder, though an excessively small reflow area tends to cause the solder bump to yield a poor connection due to inadequate adhesion.

Because the flip chip solder bump 16 is registered and soldered directly to the conductor 12, the conductor 12 must be formed of a solderable material, which as used herein means that a tin, lead or indium-based alloy is able to adhere to the conductor 12 through the formation of a metallurgical bond. In contrast, the solder stops 14 are intentionally formed of a nonsolderable material, meaning that a tin, lead or indium-based solder will not adhere to the material for failure to form a metallurgical bond. Upon reflow, the rectangular-shaped reflow area formed by the solder stops 14 on the conductor 12 yields a solder bump connection having a semi-spherical shape.

While flip chip conductors equipped with solder stops as shown in FIG. 1 are widely used in the art, trends in the industry have complicated the ability for solder bumps with solder stops to yield solder connections that provide adequate stand-off heights for flip chips. Specifically, as flip chips have become more complex, the number of bumps that must be accommodated along the chip perimeter has increased. In turn, the conductors to which the bumps are registered and soldered have become more closely spaced and narrower, e.g., line widths of about 0.4 millimeter or less. Such circumstances have complicated the design and fabrication of solder stops. As a result, solder bump connections having adequate stand-off height are more difficult to consistently produce, which increases the difficulty of adequately dispersing encapsulation materials between flip chips and their substrates. Inadequate stand-off height also corresponds to reduced compliance of the solder connection, rendering the solder connections more susceptible to fatigue fracture, and increases the difficulty with which solder flux residue is removed following the solder process. Finally, if inadequate stand-off height occurs with fine pitch conductors, interaction and contact between adjacent solder bump connections are also more likely to occur due to excessive lateral flow of the solder during reflow.

Accordingly, it would be desirable if an improved method were available for controlling the stand-off height of a surface mount device following reflow in which a solder bump connection is formed to mechanically mount the device to a surface. It would also be desirable if such a method was able to control the shape of a solder bump connection by carefully shaping the solderable area on a conductor, yet eliminated the use of solder stops. Finally, it would be desirable if such a method was particularly applicable to surface mount devices having fine pitch terminal patterns.

SUMMARY OF THE INVENTION

It is an object of this invention to provide a method for soldering surface mount circuit devices, such as flip chips, to a conductor without using solder stops to control the height of a solder bump connection attaching the device to the conductor.

It is another object of this invention that such conductors are formed of a nonsolderable conductive material on which a shaped solderable region is provided, such that each solderable region determines the placement, height and shape of a solder bump connection formed by a solder bump that has been registered and reflowed on the conductor.

It is still another object of this invention that the shapes of the solderable regions are selected to attain a particular shape and distribution of the solder bump on each conductor, so as to achieve mechanical and processing advantages over traditional solder bump connections.

The present invention provides a conductor for a surface mount circuit device, such as a flip chip, and a method for attaching such a device to the conductor with solder bump connections. Solder bump connections formed by the method are characterized as being accurately located on the conductor and having a shape that achieves an adequate stand-off height for the device, promotes stress relief during thermal cycling, and allows penetration of cleaning solutions and mechanical bonding and encapsulation materials between the device and its substrate.

According to this invention, the above benefits are achieved by forming the conductors of a nonsolderable material, on which a specially shaped solderable region is formed. The solderable region is preferably in the form of a pillar that is selectively formed on the surface of the conductor to have a shape and size that determine the distribution, shape and height of the solder bump connection on the conductor following reflow. According to this invention, a molten solder alloy will coalesce on the pillar, such that the shape of the pillar will determine the shape, height and distribution of the solder bump connection on the conductor following reflow. As a result, solderable pillars formed according to this invention can be appropriately sized and shaped to ensure that device solder bumps registered with the pillars will form connections having an adequate height and a favorable shape for allowing an encapsulation material to flow between the device and substrate, without the use of prior art solder stops. In addition, this invention unexpectedly promotes certain process and reliability-related properties, including maximized spacing between adjacent bumps, reduced stress at the bump-chip and bump-conductor interfaces, and improved chip alignment.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 2:
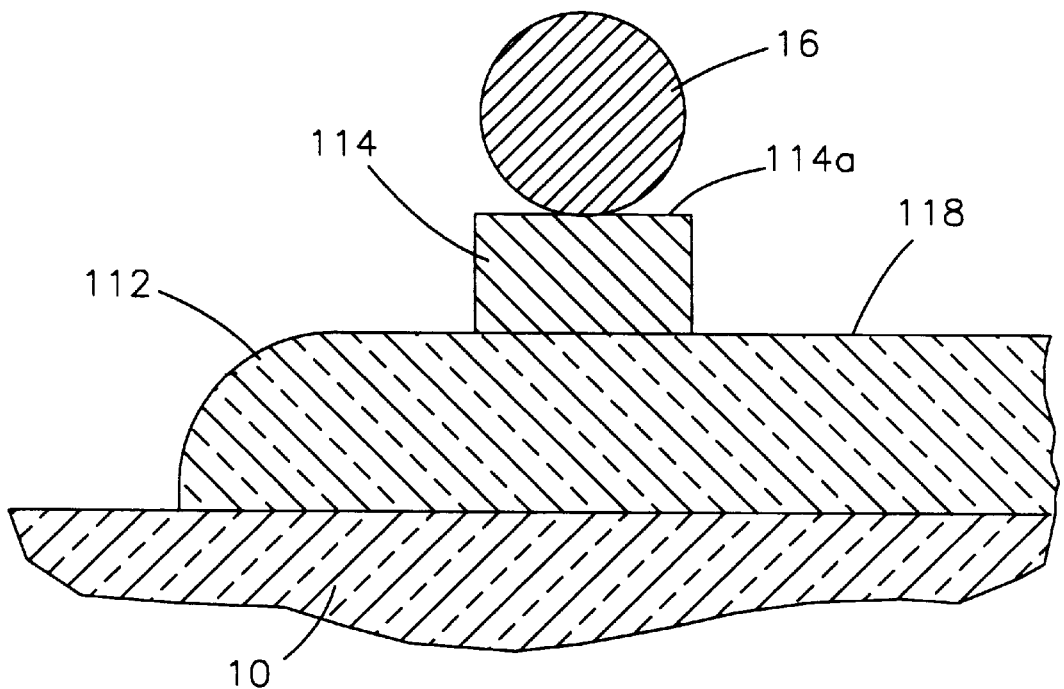
FIG. 2 is a cross-sectional view of a solder bump of a surface mount device registered with a solderable pillar formed on a nonsolderable conductor in accordance with the present invention.

With reference to FIG. 2, there is shown a solder bump connection for a flip chip (not shown) in accordance with this invention. As shown, the solder bump connection is as it appears following registration of a solder bump 16 with a conductor 112, but prior to a solder reflow operation, such that the solder bump 16 still has a spherical shape characteristic of solder bumps formed conventionally on a surface mount device. The conductor 112 has been printed or otherwise formed on a substrate 10, which may be a ceramic substrate, printed wiring board, flexible circuit or silicon substrate, as is known in the art. The solder joint connection further includes a pillar 114 on the surface 118 of the conductor 112. According to this invention, the solder bump 16 is registered with an upper surface 114a of the pillar 114 in preparation for the reflow operation. As is conventional for electronic applications, the solder bump 16 may be a tin or lead-base solder alloy that can be reflowed at sufficiently low temperatures to avoid thermal damage to the flip chip circuitry.

According to this invention, the conductor 112 is formed of a nonsolderable material, while the pillar 114 is formed of a solderable material. As used herein, the term "nonsolderable" denotes a material to which solder will not metallurgically bond and reliably adhere for purposes of making an electrical interconnection, while "solderable" denotes a material to which such solder will metallurgically bond and reliably adhere, as determined in the art using known test methods. The definition for "nonsolderable" applies to various materials known to those skilled in the art. Conductor compositions deemed nonsolderable according to this definition generally contain sufficient amounts of additions or constituents, such as oxides and glass materials, that prevent a solder from metallurgically bonding to the conductor 112. Nonsolderable conductor compositions known in the art include various silver-platinum and silver-palladium alloys. A notable example is a thick film conductor composition identified as "4012" produced by Delco Electronics Corporation, which is a silver-palladium alloy characterized by a relatively high silver content and a low palladium content.

In contrast, electrically conductive compositions deemed "solderable" according to this invention do not contain levels of additions or constituents (e.g., oxides and glass materials) that would prevent a solder from metallurgically bonding to the pillar 114. Examples of solderable materials also include various silver-platinum and silver-palladium alloys used to form thick film conductors. Notable examples are thick film conductor compositions identified as QS179, Q170P and 7484F, each of which is produced and commercially available from E.I. DuPont de Nemours and Company, Inc., of Wilmington, Del. The QS179 and Q170P compositions are based on silver-platinum alloys (Q170P being photo-imageable), while the 7484F composition is based on a silver-palladium alloy.

As is evident from FIG. 2, the nonsolderable characteristic of the conductor 112 in combination with the solder-ability of the pillar 114 causes the solder bump 16 to form a solder bump connection exclusively on the pillar 114 after reflow. As a result, the location of the pillar 114 dictates the location of the solder bump connection on the conductor 112. Furthermore, it has been determined that the size and shape of the pillar 114 also control the height, shape and distribution of the solder bump connection on the conductor 112. As the molten solder alloy coalesces during reflow, the surface tension of the alloy constrains the final shape of the solder bump connection in accordance with the size and shape of the surface 114a of the pillar 114. Based on this determination, the shape of the pillar 114 can be tailored to control the height of the solder bump connection. Furthermore, certain shapes for the pillar 114 have also been found to promote one or more additional processing and mechanical advantages for solder bump connections, such as minimizing the stress in the solder bump connection by controlling the shape of the reflowed solder, minimizing interaction between adjacent solder bumps by drawing reflowed solder out along the lengths of adjacent conductors, minimizing stress at the solder/conductor interface by providing a graded or stepped interface, increasing the distance between adjacent solder bump connections without resorting to increasing the distance between their conductors, improving the alignment of the surface mount device to the conductors of its conductor pattern by optimally shaping the pillars at the corners of the device, and enabling easier epoxy underfill by shaping the pillars to generate solder bump connections that direct epoxy under the device.

Figure 1:
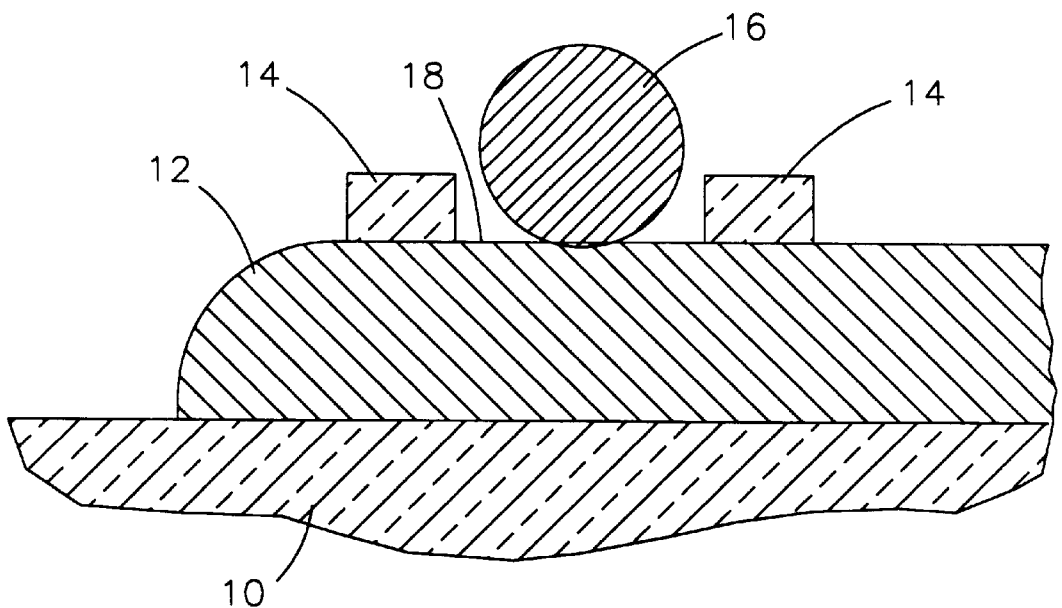
FIG. 1 is a cross-sectional view of a solder bump of a surface mount device registered with a solderable conductor in accordance with the prior art.
Figure 3:
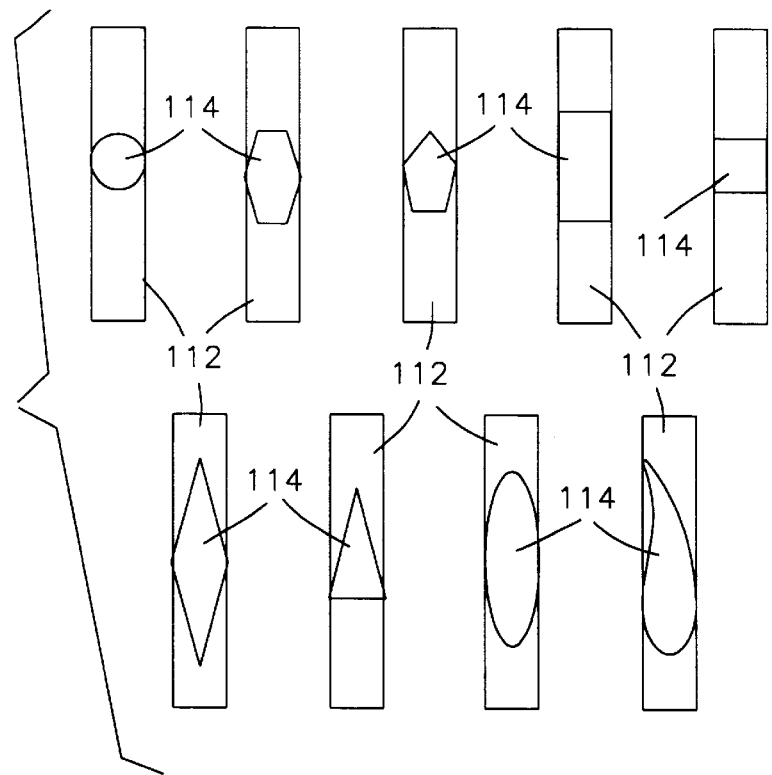
FIG. 3 is a plan view of conductors with solderable pillars of various shapes in accordance with this invention.

The accuracy with which the dimensions of the pillar 114 can be tailored by printing or photo-imaging techniques yields solder bump connections whose size, shape and height can be more precisely and readily obtained than is possible with prior art solder stops of the type illustrated in FIG. 1. FIG. 3 represents some of the various shapes that are possible for the pillars 114 of this invention. Pillars 114 are shown as having circular, hexagonal, pentagonal, rectangular, square, diamond, triangular, oval and "comma" shapes, though it is foreseeable that other shapes could be used. As will become apparent from the following description, particularly desirable shapes for the pillars 114 are those that are elongated in the longitudinal direction of the conductor, as represented by all but the circular and square-shaped pillars 114 depicted in FIG. 3.

Solder bumps 16 for registration with the pillars 114 of this invention are generally formed directly on the surface mount device prior to registration with the conductor pattern. The solder alloy for the bumps 16 can be screen printed or electrodeposited on contact pads provided on the device, as is conventional. Suitable solder alloys include, but are not limited to, tin-based, lead-based and indium-based alloys, with a notable example being tin-lead alloys containing about 10 to about 60 percent tin, with possible alloying additions of antimony, silver, etc. The solder is accurately deposited on the chip such that, after reflowing, each resulting solder bump 16 will accurately and uniquely register with a corresponding pillar 114 when the device is registered with the conductor pattern. Thereafter, the solder bumps 16 are reflowed by heating, such that the solder wets and adheres to the pillars 114, thereby attaching the device to the conductor pattern and the underlying substrate 10. Reflow can be achieved by any of a number of techniques well known in the art, and therefore will not be discussed in detail here.

During the evaluation of this invention, solderable pillars 114 of each shape shown in FIG. 3 were successfully printed on nonsolderable conductors having widths of about 15 to 35 mils (about 0.4 to 0.9 millimeter). The solderable pillars 114 were formed to cover only a limited portion of their corresponding conductors 112 in order to appropriately limit the size of the solder bumps 16 after reflow. Circular-shaped pillars 114 were formed to have diameters equal to the width of their conductors 112, while the area of other pillars 114 were controlled to occupy the same area as either a square having sides equal to the width of the conductor 112, or a rectangle having one pair of sides equal to the width of the conductor 112 and the second pair of sides equal to twice the width of the conductor 112, as shown in FIG. 3.

FIGS. 4 through 7 represent the results of reflowing tin-lead solder balls placed on pillars 114 formed in accordance with this invention. The pillars 114 shown in FIGS. 4 through 7 are oval, diamond, triangular and square-shaped, respectively. From these Figures, it can be seen that the shapes of the pillars 114 strongly influence the shapes of the resulting solder bumps 16 after reflow. Notably, the oval-shaped pillar 114 caused the solder bump 16 to be drawn in opposite directions coinciding with the longitudinal direction of the conductor 112. This influence minimized the amount by which the reflowed solder ball 16 extended beyond the edges of the conductor 112, and therefore reduced the incidence of interaction between adjacent solder bumps 16.

Figure 4:
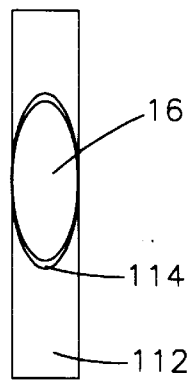
FIGS. 4–7 are plan views of solder bump connections whose shapes have been determined by solderable pillars in accordance with this invention.
Figure 5:
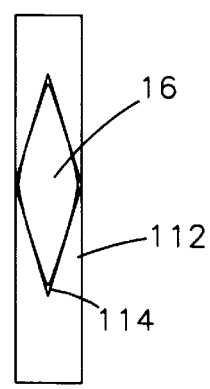

The diamond-shaped pillar 114 of FIG. 5 caused the solder bump 16 to be drawn toward the vertices of the diamond shape, though not covering the surface of the pillar 114 as fully as did the solder bump 16 on the oval-shaped pillar 114 of FIG. 4. This characteristic of the diamond-shaped pillar 114 caused the solder bump 16 to have a tapered width, with the solder bump 16 being widest near the center of the pillar 114 and narrowest near the extreme longitudinal ends of the pillar 114. The result was a graded solder-to-conductor interface that reduces stresses at the solder-to-conductor interface during thermal excursions.

Figure 6:
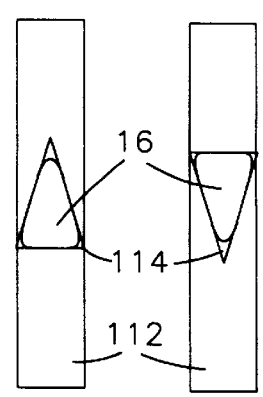
Figure 7:
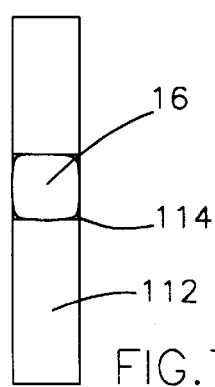

Triangular-shaped pillars 114 and the resulting triangular-shaped solder bumps 16 are shown in FIG. 6. By forming the pillars 114 to "point" in opposite directions as shown in FIG. 6, it can be seen that the distance between two adjacent solder bumps 16 is effectively increased without increasing the distance between their conductors 112. Finally, FIG. 7 shows a square solderable pillar 114 whose solder bump 16 is also roughly square-shaped. The presence of square-shaped solder bumps at the corners of a flip chip can be employed to facilitate alignment of the chip with its conductor pattern.

To evaluate the resulting shape of solder bump connections formed by the method of this invention, conductor patterns were formed for mounting fine pitch flip chips. Each pattern consisted of conductors printed from a nonsolderable silver-palladium composition to have widths of about 3 mils (about 0.08 millimeter). Diamond-shaped pillars in accordance with FIG. 5 were formed on each conductor so as to form a pattern that was complementary to solder bumps formed on flip chips. Following registration of the flip chips with their conductor patterns, a conventional solder reflow operation was performed so as to mechanically and electrically connect the flip chips to the patterns with solder bump connections formed by the flip chip solder bumps. Using an X-ray characterization technique, the shape of each solder bump connection was confirmed to be narrow and drawn out along the length of its conductor under the influence of the diamond-shaped solderable pillars, such that the solder bump connections did not contact their corresponding nonsolderable conductors. Accordingly, the shape of the solder bump connection was shown to be strongly influenced by the shape of the solderable pillar after reflow.

While the invention has been described in terms of a preferred embodiment, it is apparent that other forms could be adopted by one skilled in the art. Accordingly, the scope of the invention is to be limited only by the following claims.

What is claimed is:

1. A method of forming a conductor for receiving a component with at least one solder bump already formed thereon, the method comprising the steps of:

forming a nonsolderable conductor on a substrate so as to define a conductor pattern; and forming a solderable conductor pillar on a limited portion of the nonsolderable conductor, the solderable conductor pillar having a cross-sectional shape chosen from the group consisting of square, circular and shapes that are elongate in a longitudinal direction of the conductor for controlling the shape of the solder bump when the solder bump is received on the solderable conductor pillar and reflowed to attach the component.

2. A method as recited in claim 1, wherein the nonsolderable conductors are formed from a material containing an alloy chosen from the group consisting of silver-palladium and silver-platinum alloys.

3. A method as recited in claim 1, wherein the solderable conductor pillars are formed from a material containing an alloy chosen from the group consisting of silver-palladium and silver-platinum alloys.

4. A method as recited in claim 1, wherein the conductor pattern includes a plurality of nonsolderable conductors having terminal portions disposed side-by-side along parallel longitudinal axes, the solderable conductor pillars are formed on such terminal portions and the solderable conductor pillars have cross-sectional shapes that are elongate along respective longitudinal axes of said nonsolderable conductors.

5. A method as recited in claim 1, wherein the step of forming a nonsolderable conductor entails forming a pair of adjacent nonsolderable conductors, and wherein a solderable conductor pillar is formed on each of the adjacent nonsolderable conductors, each solderable conductor pillar having a triangular cross-sectional shape characterized by a base side and two lateral sides that intersect to define a vertex, the vertices of such pillars facing in opposite directions.

6. A method as recited in claim 1, wherein the step of forming a nonsolderable conductor entails forming a plurality of nonsolderable conductors, and wherein a solderable conductor pillar is formed on each of the nonsolderable conductors, the solderable conductor pillars having at least two different cross-sectional shapes.

7. A method as recited in claim 6, wherein the conductor pattern has a square-shaped corner, and the solderable conductor pillar in the square-shaped corner of said conductor pattern has a square cross-sectional shape.

8. A conductor pattern formed by the method recited in claim 1.

9. A conductor pattern as recited in claim 8, further comprising a surface mount device registered with the conductor pattern, the surface mount device having a solder bump reflow soldered to the solderable conductor pillar on the nonsolderable conductor, the solderable conductor pillar having a diamond-shape cross-section and the solder bump defining a solder bump connection having a tapered width in a longitudinal direction of the nonsolderable conductor, the solder bump connection having a maximum width near a midpoint of the solderable conductor pillar.

* * * * *